(12) United States Patent
Gibson et al.

(10) Patent No.: US 7,212,488 B2
(45) Date of Patent: May 1, 2007

(54) METHOD AND DEVICE ENABLING CAPACITIVE PROBE-BASED DATA STORAGE READOUT

(75) Inventors: Gary Gibson, Palo Alto, CA (US); Lennie Kiyama, Los Altos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/085,939

(22) Filed: Mar. 21, 2005

(65) Prior Publication Data

US 2006/0219905 A1 Oct. 5, 2006

(51) Int. Cl.
*G11B 7/00* (2006.01)

(52) U.S. Cl. .................... 369/126; 369/47.1

(58) Field of Classification Search .............. 369/126, 369/47.1, 124, 128, 132, 53
See application file for complete search history.

(56) References Cited

U.S. PATENT DOCUMENTS

| | | | |
|---|---|---|---|
| 3,842,194 A | 10/1974 | Clemens | |
| 3,920,930 A | 11/1975 | Sobczyk | |
| 4,340,958 A | 7/1982 | Dennis et al. | |
| 4,450,550 A | 5/1984 | Sterzer | |
| 4,575,822 A | 3/1986 | Quate | |
| 4,912,822 A | 4/1990 | Zdeblick et al. | |
| 4,998,016 A | 3/1991 | Nose et al. | |
| 4,998,018 A | 3/1991 | Kurahashi et al. | |
| 5,015,850 A | 5/1991 | Zdeblick et al. | |
| 5,053,995 A | 10/1991 | Kajimura et al. | |
| 5,235,187 A | 8/1993 | Arney et al. | |
| 5,283,437 A | 2/1994 | Greschner et al. | |
| 5,289,004 A | 2/1994 | Okada et al. | |
| 5,329,513 A | 7/1994 | Nose et al. | |
| 5,345,815 A | 9/1994 | Albrecht et al. | |
| 5,371,728 A | 12/1994 | Sakai et al. | |
| 5,373,494 A | 12/1994 | Kawagishi et al. | |
| 5,398,229 A | 3/1995 | Nakayama et al. | |

(Continued)

FOREIGN PATENT DOCUMENTS

DE 100 29 593 A1 6/2000

(Continued)

OTHER PUBLICATIONS

G. Cherubini, et al., The Millipede, a Very Dense, Highly Parallel Scanning-Probe Data-Storage System, IBM Research Zurich Research Laboratory, ESSCIRC 2002, pp. 121-125.

(Continued)

*Primary Examiner*—Kiet T. Nguyen (57) ABSTRACT

A method and apparatus for reading data bits stored on a storage medium is provided. The apparatus comprises a data probe structure including a data probe and at least one switch attached to the data probe, a controllable voltage source configured to supply voltage to the data probe structure, and a charge amplification structure configured to receive charge from the data probe structure. The controllable voltage source applies a first voltage to the data probe structure and subsequently applies a second voltage to the data probe structure, thereby causing a sense capacitance to charge and then discharge into the charge amplification structure. Certain embodiments of the design may employ dummy cells, diodes in place of switches, and may use a single line to control voltage switching. A lock-in amplifier approach is also presented.

39 Claims, 8 Drawing Sheets

U.S. PATENT DOCUMENTS

| | | |
|---|---|---|
| 5,412,641 A | 5/1995 | Shinjo et al. |
| 5,426,631 A | 6/1995 | Miyazaki et al. |
| 5,481,528 A | 1/1996 | Eguchi et al. |
| 5,526,334 A | 6/1996 | Yamano et al. |
| 5,537,372 A | 7/1996 | Albrecht et al. |
| 5,546,374 A | 8/1996 | Kuroda et al. |
| 5,583,286 A | 12/1996 | Matsuyama |
| 5,610,898 A | 3/1997 | Takimoto et al. |
| 5,679,952 A | 10/1997 | Lutwyche et al. |
| 5,680,387 A | 10/1997 | Yamano et al. |
| 5,721,721 A | 2/1998 | Yanagisawa et al. |
| 5,751,683 A | 5/1998 | Kley |
| 5,751,685 A | 5/1998 | Yi |
| 5,753,911 A | 5/1998 | Yasuda et al. |
| 5,856,672 A | 1/1999 | Ried |
| 5,856,967 A | 1/1999 | Mamin et al. |
| 5,883,705 A | 3/1999 | Minne et al. |
| 5,953,306 A | 9/1999 | Yi |
| 5,969,345 A | 10/1999 | Williams et al. |
| 5,994,698 A | 11/1999 | Kawade et al. |
| 6,072,764 A | 6/2000 | Shido et al. |
| 6,218,086 B1 | 4/2001 | Binnig et al. |
| 6,337,477 B1 | 1/2002 | Shimada et al. |
| 6,369,385 B1 | 4/2002 | Muray et al. |
| 6,401,528 B1 | 6/2002 | Lambert et al. |
| 6,465,782 B1 | 10/2002 | Kendall |
| 6,477,132 B1 * | 11/2002 | Azuma et al. ............... 369/126 |
| 6,515,957 B1 | 2/2003 | Newns et al. |
| 6,519,221 B1 | 2/2003 | Manalis et al. |
| 6,665,258 B1 | 12/2003 | Dietzel et al. |
| 7,054,257 B2 | 5/2006 | Binnig et al. |
| 2003/0053400 A1 | 3/2003 | Cho et al. |
| 2004/0019757 A1 | 1/2004 | Binnig et al. |
| 2004/0218507 A1 | 11/2004 | Binnig et al. |
| 2005/0025034 A1 | 2/2005 | Gibson |
| 2005/0147017 A1 | 7/2005 | Gibson |
| 2006/0043288 A1 | 3/2006 | Binnig et al. |

FOREIGN PATENT DOCUMENTS

| | | |
|---|---|---|
| EP | 0 363 147 B1 | 4/1990 |
| EP | 1 369 864 A2 | 12/2003 |

OTHER PUBLICATIONS

E. Eleftheriou, et al., "Millipede—a MEMS-based Scanning-Probe Data-Storage System," 2002 IEEE Trans. Magnetics, 2002.

G. Binnig, et al., "Ultrahigh-density atomic force microscopy data storage with erase capability," 1999 American Institute of Physics, Applied Physics Letters, vol. 74, No. 9, Mar. 1, 1999, pp. 1329-1331.

H.J. Mamin, "Thermal writing using a heated atomic force microscopic tip," 1996 American Institute of Physics, pp. 433-435, May 13, 1996.

Despont, M. et al. "VLSI-NEMS Chip for AFM Data Storage" Tech. Digest IEEE Int. MEMS '99 Conf. Orlando Fl, Jan. 17-21, 1999 pp. 564-569.

Bom, Axel "Nanotechnologische Anwendungen Der Rasterkapazitatsmikroskopie Und Verwandter Rastersondenmethoden" Dissertation, Hamburg 2000 pp. 46-55.

* cited by examiner

FIG. 7

METHOD AND DEVICE ENABLING CAPACITIVE PROBE-BASED DATA STORAGE READOUT

BACKGROUND OF THE INVENTION

1. Field of the Invention

The present invention relates generally to the field of data storage, and more particularly to the facilitating readout from a data storage device.

2. Description of the Related Art

Storage media for computers and other types of electronic devices include volatile memory and non-volatile memory. Volatile memory loses its contents when power is no longer supplied to the memory, whereas non-volatile memory maintains its contents even when power is not supplied to the memory. The most common type of volatile memory is dynamic random-access memory (DRAM), commonly available as and implemented as an integrated circuit (IC). Non-volatile memory has been available in the form of magnetic and optical media, including hard disk drives, floppy disks, compact disc read-only memories (CD-ROMs), CD re-writable (CD-RW) discs, and digital versatile discs (DVDs), among others. Historically, non-volatile memory implemented as an IC was primarily available as ROM that was not re-recordable, such as hard-wired ROM and programmable ROM (PROM). More recently, IC non-volatile memory has become available as various types of flash memory, which is more technically known as electrically erasable PROM (EEPROM).

Storage density of the storage media employed in computing devices is ever increasing. One available tool known today that provides enhanced storage density and may be scaled to ever smaller sizes, such as down to the nanometer scale, is a nanometer probe tip. Nanometer probe tips are used in atomic force microscopes (AFM) and scanning tunneling microscopes (STM) for imaging and structuring down to the atomic scale. The simple tip is a very reliable tool that provides enhanced local confinement of interaction.

In recent years, AFM thermo-mechanical recording in polymer storage media has undergone extensive modifications mainly with respect to the integration of sensors and heaters designed to enhance simplicity and to increase data rate and storage density. Using heated cantilevers, thermo-mechanical recording at 400 Gb/in$^2$ storage density and data rates of a few Mb/s for reading and 100 kb/s for writing have been demonstrated.

Such prior thermo-mechanical writing applies a local force to a polymer layer using a cantilever/tip and softens the polymer layer using local heating. Application of sufficient heat forms an indentation in the storage medium, forming a written bit. The same tip can read the written bit by the deflection of the cantilever when moved into the indentation, in combination with the electrical resistance of a sensing circuit based on cantilever movement.

While writing data or bits, the heat transfer from the tip to the polymer through the small contact area is initially very poor and improves as the contact area increases. The tip is heated to a relatively high temperature to initiate the melting process. Once melting has commenced, the system presses the tip into the polymer, increasing heat transfer to the polymer and the volume of melted polymer, and hence increasing bit size. After melting has started and the contact area has increased, the heating power available for generating indentations increases by at least ten times to become 2% or more of the total heating power, depending on the design. In order to provide a complete data storage method, a data read process should provide an adequate Signal-to-Noise Ratio (SNR) at an acceptable data rate One method for reading currently available depends on the modulation of the gap between a warm (non-writing) cantilever and the medium. Gap modulation results from the tip following medium topography introduced by the foregoing writing process. The gap modulation generates a synchronous modulation in the cantilever temperature through a variation in thermal flux between cantilever and medium. The temperature coefficient of resistivity of the heater or other temperature sensing element on the cantilever translates this temperature variation into a resistance variation, which is sensed by appropriate electronics as the output signal. The bandwidth or data rate for this read method is fundamentally limited by the thermal time constant of the heater/cantilever.

In addition to an SNR problem with the aforementioned readback scheme, the scheme also has difficulty addressing large arrays of tightly packed probes. Probes may be positioned parallel to one another and/or in relatively close proximity, but design advantages may be realized by utilizing alternative readback schemes whose bandwidth is not limited by thermal time constants and which minimize the area required for the read/write/erase sense and control electronics, irrespective of the form or profile of the topographic bit.

It would be advantageous to provide a design that reads these bits at a relatively high data rate with a similar or improved SNR over what has been previously available and avoids the problems associated with previous designs.

SUMMARY OF THE INVENTION

According to the present design, there is provided an apparatus for reading data bits stored on a storage medium. The apparatus comprises a data probe structure including a data probe and at least one switch attached to the data probe, a controllable voltage source configured to supply voltage to the data probe structure, and a charge amplification structure configured to receive charge from the data probe structure. The controllable voltage source applies a first voltage to the data probe structure and subsequently applies a second voltage to the data probe structure, thereby causing one switch to open and provide output voltage to the charge amplification structure.

These and other objects and advantages of all aspects of the present invention will become apparent to those skilled in the art after having read the following detailed disclosure of the preferred embodiments illustrated in the following drawings.

DESCRIPTION OF THE DRAWINGS

The present invention is illustrated by way of example, and not by way of limitation, in the figures of the accompanying drawings in which.

DETAILED DESCRIPTION OF THE INVENTION

The present design provides for data storage readout by detecting changes in data signal capacitance. The present design is a switched-capacitor design that uses a capacitive readout scheme to detect or sense very small capacitive changes associated with the deflection of the cantilever structure as the cantilever follows the surface topography of the storage medium.

Figure 1:
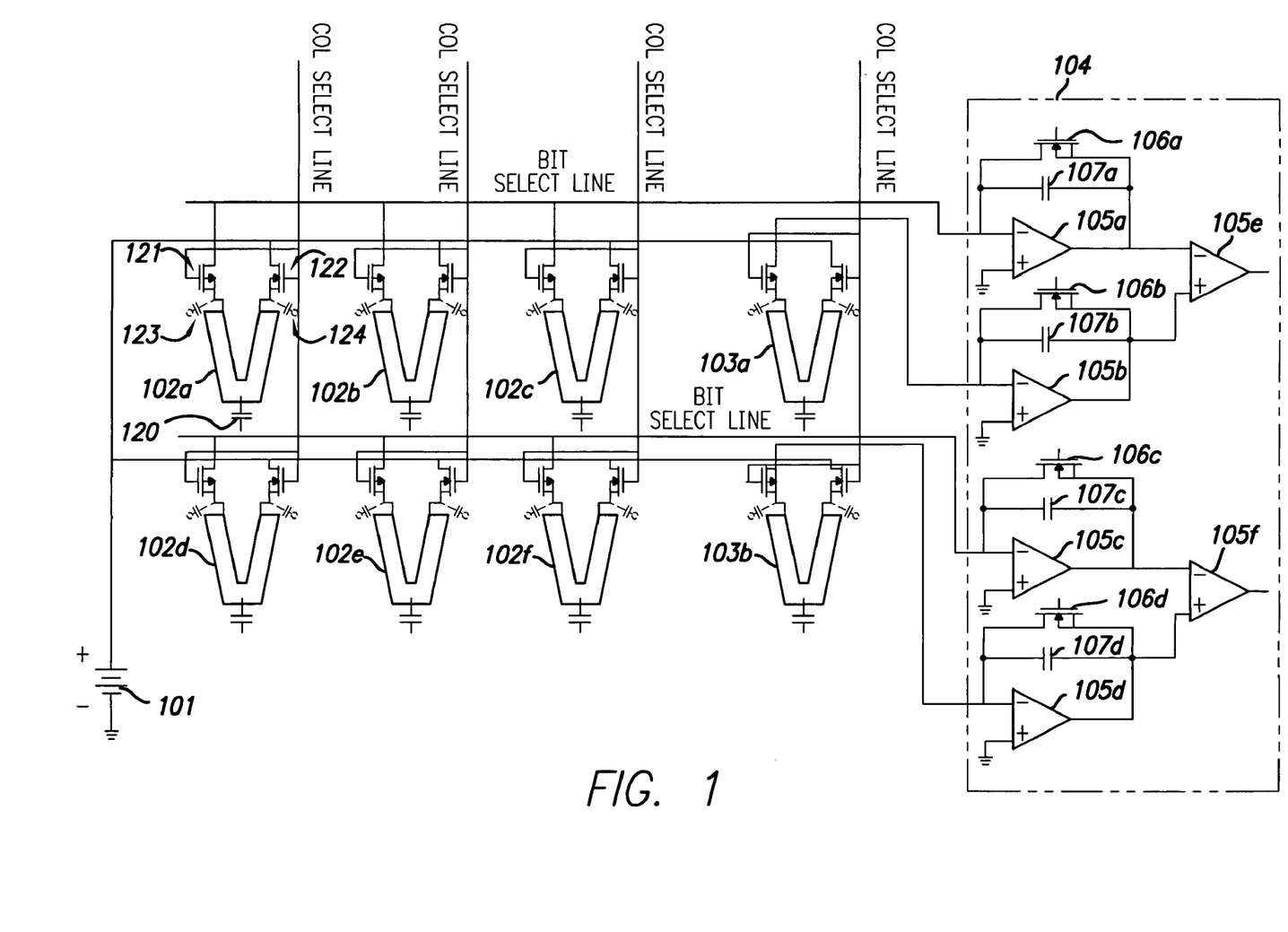
FIG. 1 illustrates a cantilever array arrangement that operates to charge signal capacitance to a voltage and subsequently release the stored charge into a charge pre-amplifier.

FIG. 1 illustrates a cantilever array arrangement that operates to charge signal capacitance to a voltage and subsequently release the stored charge into a charge pre-amplifier. From FIG. 1, column select lines and bit select lines pass vertically and horizontally, respectively, to an array of cantilevers. A pre-charge bias is provided by DC voltage source 101, which is typically controllable to offer more than one voltage level. Cantilevers 102a, 102b, and 102c are on one bit line, while cantilevers 102d, 102e, and 102f are on another bit line in the configuration shown. Cantilevers/probes 102a–f form part of the data probe structure, which may include switches or associated elements needed to perform the data probe functions described herein. More or fewer cantilevers, bit lines, and column select lines may be provided depending on desired performance. Two dummy cantilevers 103a and 103b are provided as reference cantilevers, essentially providing a basis from which a deflection of other cantilevers in the bit line can be compared. If the difference between the signal from the other cantilevers 102 and the dummy cantilevers exceeds a certain amount, the system senses a bit. To the right side of FIG. 1 is a differential charge sense amplifier array 104 that receive signals from the cantilevers and particularly the dummy cantilevers 103a and 103b. The charge amplification structure or differential charge sense amplifier array 104 employed may include amplifiers 105a–f, field effect transistors (FETs) 106a–d, and capacitors 107a–d. The differential charge sense amplifier array 104 collects the signals and amplifies the signals to provide a sensed output, indicating the presence of a read bit.

A capacitance 120 exists between each of the cantilever or probe structures, such as cantilever 102a, and its surroundings. Changes in this capacitance can be monitored to sense a displacement of the probe. Two wires are connected to the cantilever/probe 102a, and represented in broken lines are capacitances 123 and 124, each connected to one line from the cantilever/probe 102a representing stray capacitance from the device. Two FETs, first FET 121 and second FET 122 provide control for the current and voltage supplied to the structure, as described below.

To monitor the capacitance 120 between the cantilever or probe, such as the cantilever/probe 102a, 102b, 102c, and so forth, and the storage medium (not shown), the system applies a voltage to one of the column lines. Alternately, the system can monitor the capacitance between the cantilever or probe and other fixed portions of the device, such as the chip supporting the cantilever. Application of voltage to a column line opens the FETs on one leg of the cantilevers along that column line, e.g. the first FET 121, and closes the complementary second FETs on the other leg of the cantilevers along that column line, e.g. FET 122. The closed FET, in this example FET 122, connects the conducting (capacitive) portions of the cantilever to the pre-charge voltage source 101, thereby charging the signal capacitance. Subsequently, the system changes the voltage on the column line to close first FET 121 and open second FET 122. This voltage change and FET switch enables the charge stored on the signal capacitances in the selected column to be dumped into the charge pre-amplifiers, such as differential charge sense amplifier array 104. In this way, the cantilever/probes along the selected column can be read in parallel. This "pump and dump" process can be repeated several times to build-up the charge on the charge pre-amplifiers' feedback capacitors, such as capacitor 107a or 107c, thereby increasing the output signal voltage of the differential charge amplifier array 104. The output voltage of the pre-amps, such as 105a or 105c, may be compared with the output of the reference pre-amp in the same row, such as 105b or 105d, which monitors the capacitance of the dummy cell on that row. This comparison can be performed using a differential amplifier, such as 105e or 105f. During this process, the unused columns can be kept in either the state where their pre-charge FETs are closed and their "dump" FETs are open or, alternatively, in the state where the pre-charge FET is open and the dump FET is closed. In either arrangement, the cantilevers in the unused columns generally do not contribute significantly to the signal charge.

In general, two limits may influence the number of times the foregoing process can be used before resetting the feedback capacitor, such as capacitors 107a–d, via a FET, shown in FIG. 1 as FETs 106a–d, thereby providing a controlled short across the feedback capacitor. A first limit may be represented by the number of cycles (opening and closing of the FETs for one cantilever/probe) that can be performed during the period the cantilever tip is over a given bit. This value is generally set by the desired data read rate. The second limit is a function of the saturation voltage of the output of the charge pre-amplifiers, such as pre-amplifiers 105a–d.

First FET 121 and second FET 122 may be positioned relatively close to the cantilever/probe 102a to minimize the stray capacitance from regions between the FETs and the capacitive sense elements, such as sense capacitor 120. Stray capacitance, indicated by stray capacitors 123 and 124, is indistinguishable from the signal capacitance during normal operation, so stray capacitance acts to decrease the overall SNR. Locating the first FET 121 or second FET 122 close to the "legs" of the cantilever/probe 102a can be difficult due to space limitations near the cantilevers. Additional control lines are required to control the write process, and while not shown in FIG. 1, serve to limit the available space between the FETs and the cantilever/probe. In certain circumstances, the write/erase functions and the read functions operating according to the foregoing scheme cannot be efficiently controlled by two FETs using a single control line.

Figure 2A:
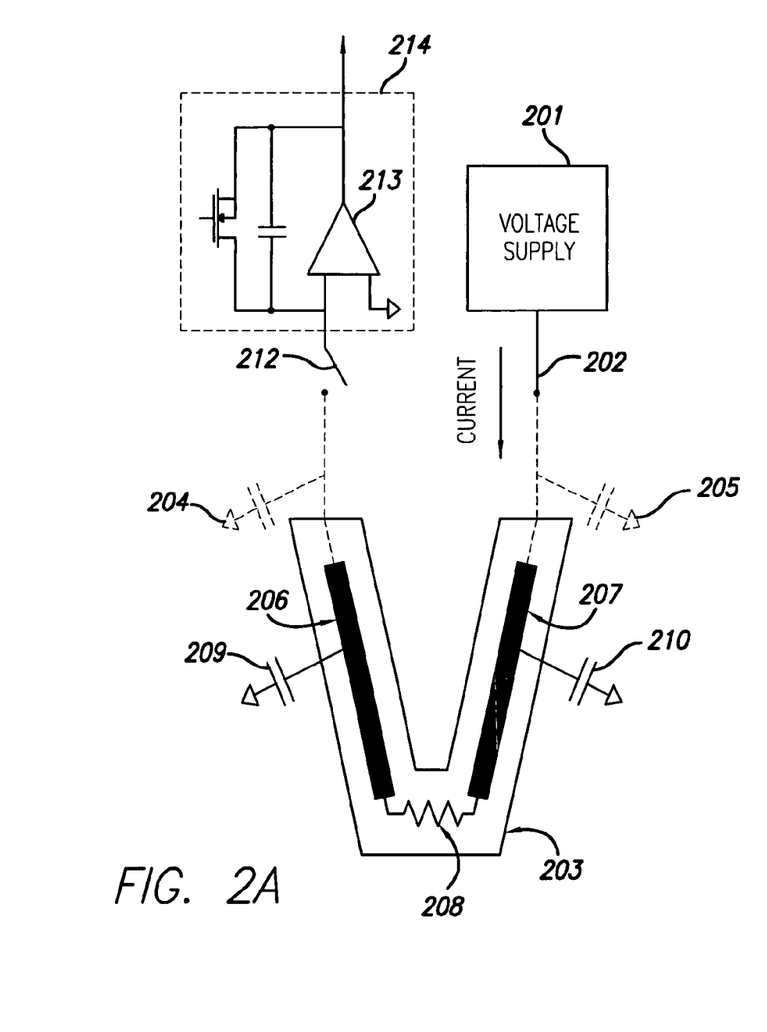
FIG. 2A is an arrangement of a cantilever/probe used with two switches in the "pump" phase of operation with the voltage supply switch closed.
Figure 2B:
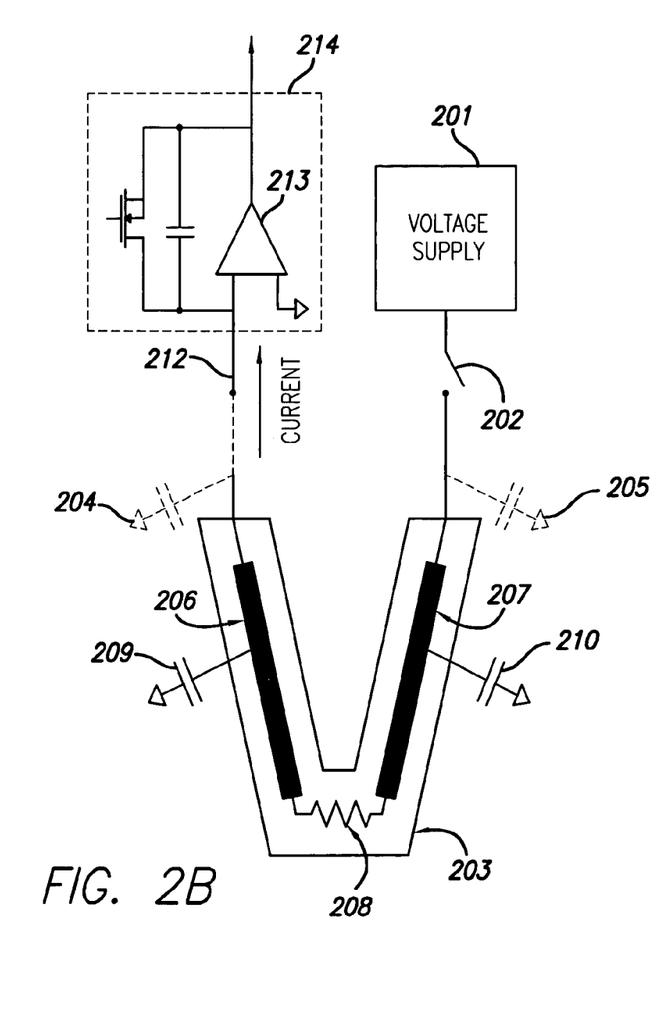
FIG. 2B shows the cantilever/probe arrangement in the "dump" phase of operation with the amplifier switch closed.
Figure 2C:
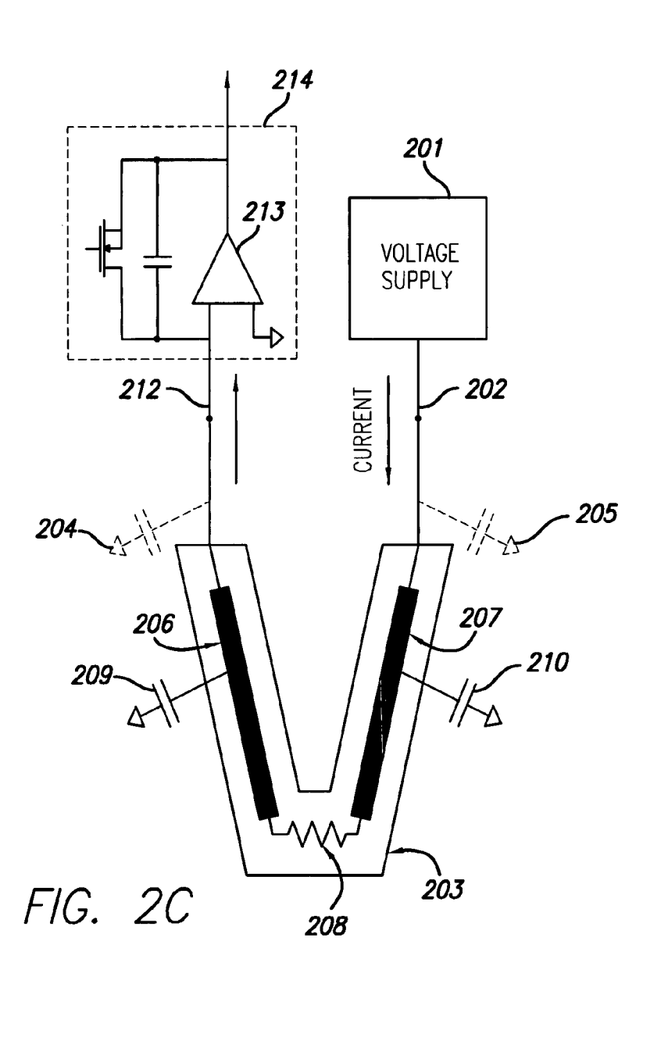
FIG. 2C illustrates the cantilever/probe arrangement in the "write/erase" phase of operation with both switches closed.

FIGS. 2A, 2B, and 2C illustrate three embodiments of three different states of FET interaction with the cantilever/probe. In FIG. 2A, voltage supply 201 passes current to cantilever/probe 203 through closed first FET switch 202. Stray capacitance is shown at points 204 and 205. In the configuration shown two elements of the cantilever/probe 203, namely first element 206 and second element 207 are joined by write resistor 208. Elements 206 and 207 can be, for example, conducting regions created on the legs of the cantilever that form one side of sense capacitors. These sense capacitances 209 and 210 are formed between first element 206 and second element 207 and stationary portions of their surroundings such as the underlying storage medium or conducting plates positioned on the cantilever support chip above the cantilevers. Open second FET switch 212 inhibits current from passing to sense amplifier 213, which is a part of differential charge sense amplifier array 214. In this complimentary FET scheme, voltage is provided to the cantilever/probe 203 until the state of the FET switches 202 and 212 change.

FIG. 2B illustrates the same implementation, with the FET switch state reversed, namely first FET switch 202 open and second FET switch 212 closed. In this arrangement, current is provided from the charged capacitances 204, 205, 209, and 210 of cantilever/probe 203 to the sense amplifier 213 of differential charge sense amplifier array 214.

FIG. 2C shows connection or closing of both first FET switch 202 and second FET switch 212. With both FETs in the "on" or conduction state, the cantilever/probe 203 can write to the storage medium or erase from the storage medium. All three states shown in FIGS. 2A, 2B, and 2C can only be provided using independent FET switch control, thus mandating two control lines for full functionality. Note from FIGS. 2A, 2B, and 2C that the sense amp can be remote from the cantilever/probe 203, but the FET switches can be positioned close to the cantilever/probe 203 to minimize stray capacitance.

All of the embodiments of FIGS. 2A, 2B, and 2C show that to achieve the needed write and read functionality generally two control lines with two FETs or other switches may be connected to each cantilever/probe 203.

In order to provide control within the tight confines presented, two solutions are provided. The first involves replacing one of the FETs with a diode, while the second uses the same voltage that charges the signal capacitance to control one of the FETs.

Diode Scheme

Figure 3A:
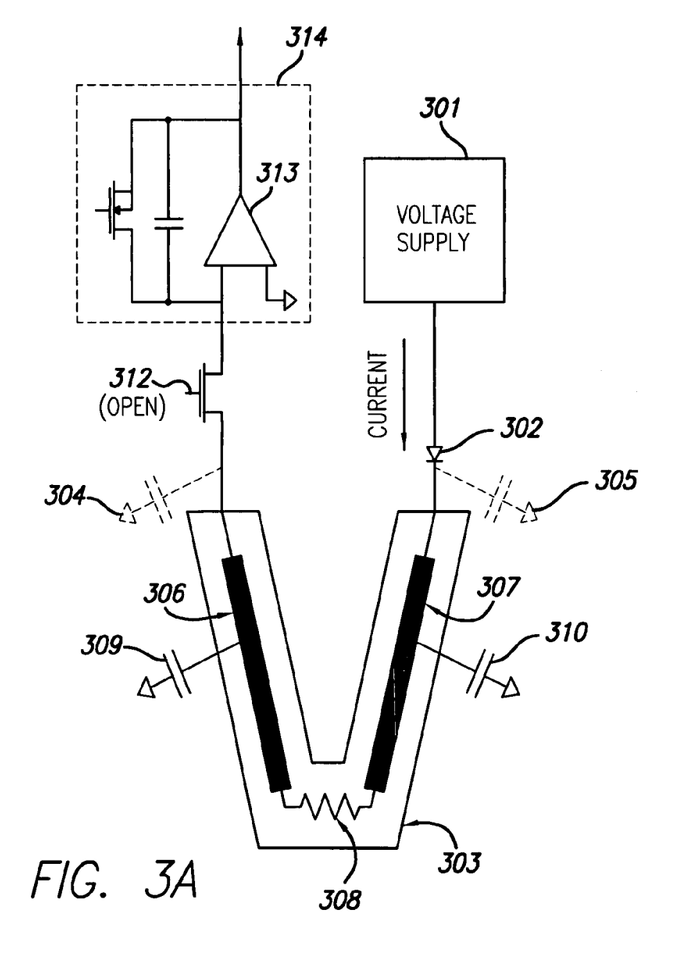
FIG. 3A illustrates a cantilever/probe arrangement using a diode and a single control line in the "pump" phase of operation.
Figure 3B:
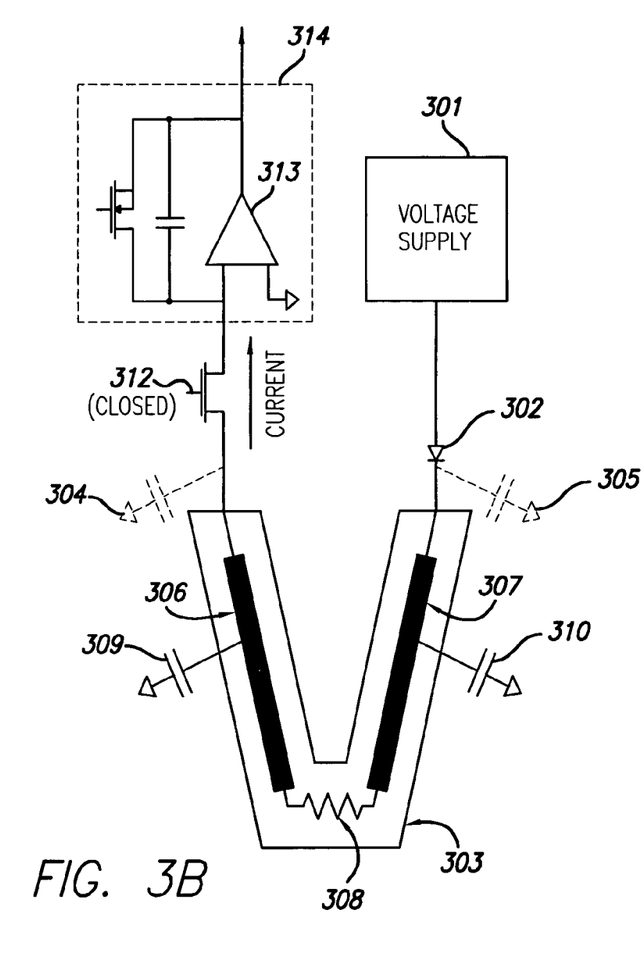
FIG. 3B shows the cantilever/probe arrangement using a diode and a single control line in the "dump" phase of operation with current applied to the diode and the amplifier switch closed.
Figure 3C:
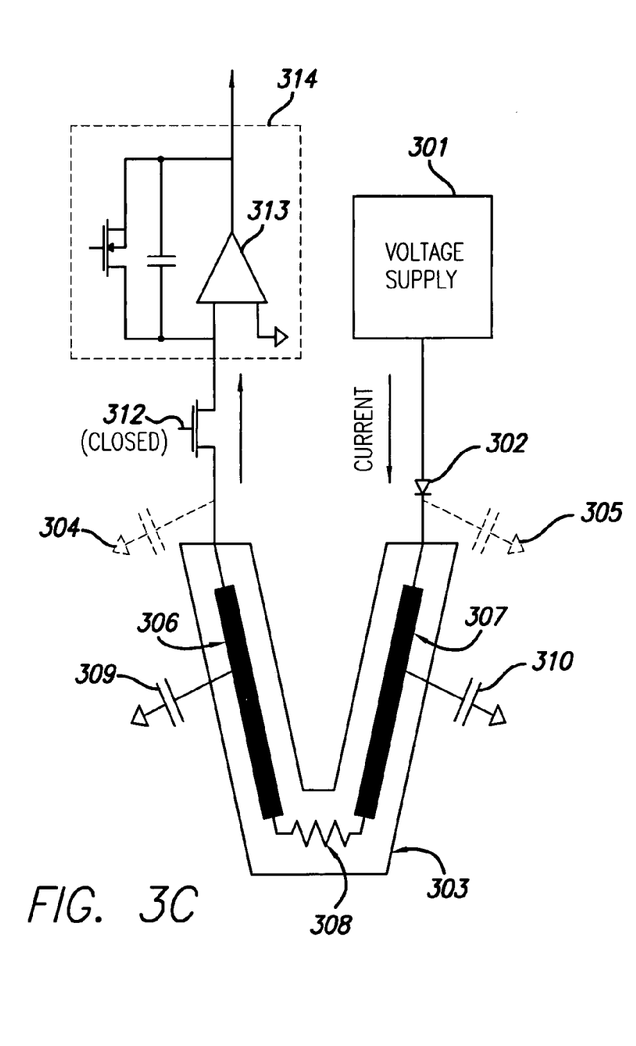
FIG. 3C illustrates the cantilever/probe arrangement using a diode and a single control line in the "write/erase" phase of operation with current flowing to the diode and the amplifier switch closed.

In one embodiment, the FET at the base of one leg of the cantilever/probe is replaced by a diode 302, as shown in FIG. 3A. FIGS. 3A, 3B and 3C show one cantilever/probe 303 in each of the three operational modes.

In FIG. 3A, voltage supply 301 passes current to cantilever/probe 303 through diode 302. Stray capacitance is shown at points 304 and 305, and in the configuration shown two elements of the cantilever/probe 303, namely first element 306 and second element 307 are joined by write resistor 308. Sense capacitances 309 and 310 are formed between first element 306 and second element 307 and stationary portions of their surroundings such as the underlying storage medium or conducting plates positioned on the cantilever support chip above the cantilevers. FET switch 312 is connected to a control line and is open in the configuration shown, thereby inhibiting current from passing to sense amplifier 313, which is a part of differential charge sense amplifier array 314. FIG. 3B illustrates the same implementation, with the FET switch 312 closed. In this arrangement, current is provided from the cantilever/probe 303 to the sense amplifier 313 of differential charge sense amplifier array 314 and not from voltage supply 301 to cantilever/probe 303. FIG. 3C shows current provided from voltage supply 301 to cantilever/probe 303, and FET switch 312 closed. With power supplied from voltage supply 301 and FET switch 312 closed, the cantilever/probe 303 can write to or erase from the storage medium. Thus in the embodiments of FIGS. 3A, 3B, and 3C, only one control line controls both FET switch 312 and diode 302. In this embodiment the diode 302 acts as a one-way valve for the current flow. Proper functioning of this embodiment requires that the reverse leakage of the diode 302 is low enough during the time required to discharge the sense capacitors such that the majority of the sense capacitances' stored charge flows to the sense amplifier array 314. The sense capacitances 309 and 310 and the charging voltage and duration used during read may be chosen so as not to heat the resistive heater 308 to a level causing inadvertent writing or erasing. A relatively small diode junction capacitance can provide certain advantages, since the charge developed across the forward bias junction subtracts from the sense capacitance when the pump voltage returns back to zero during the dump process.

Figure 4:
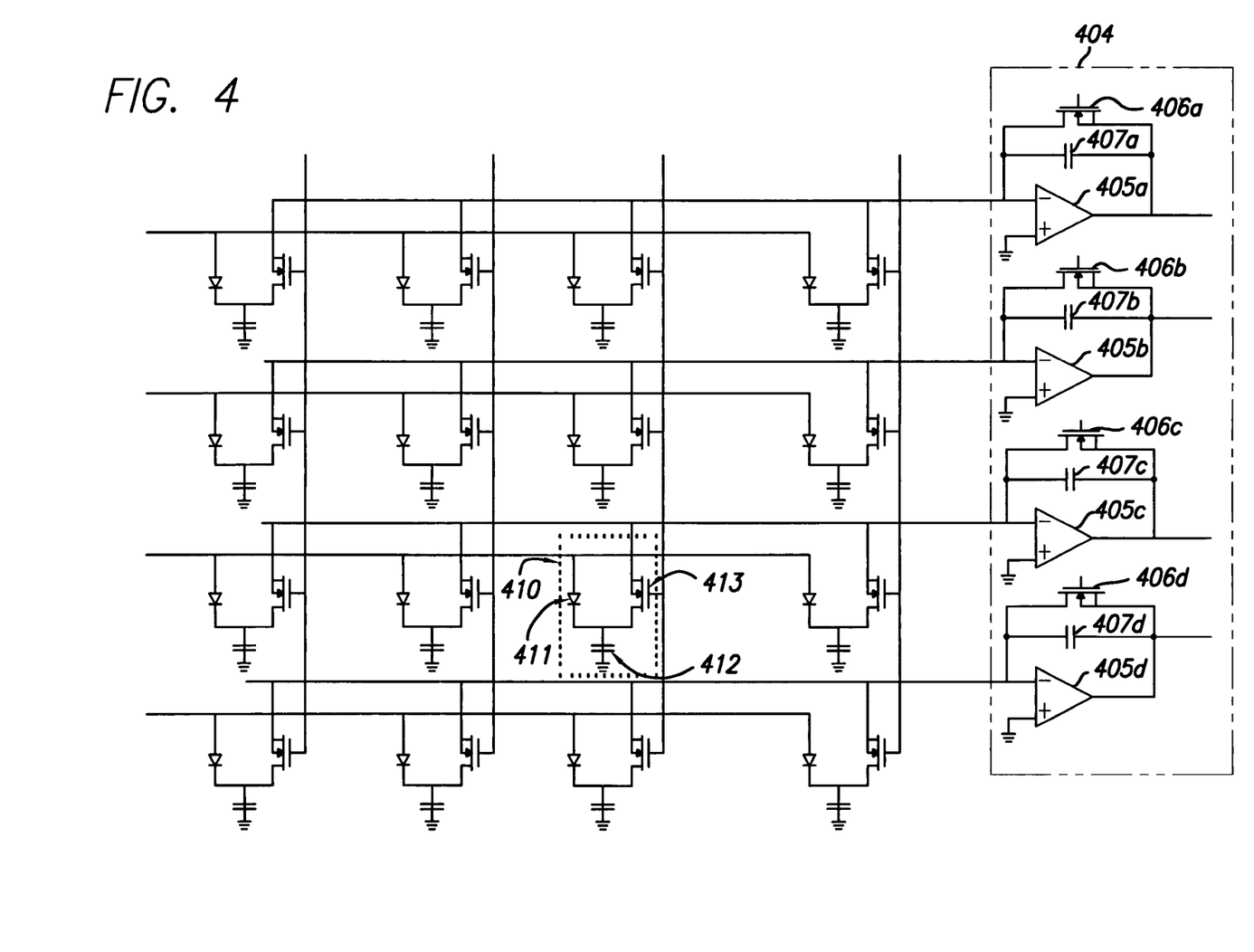
FIG. 4 shows parallel operation of multiple probes, each with a diode and single FET operated by one control line.

Another embodiment allows for operation of multiple probes, each with a diode and single FET operated by one control line, as shown in FIG. 4. In the configuration of FIG. 4, only one FET and one diode are needed per cantilever/probe to control all the operational modes: current/voltage into the cantilever/probe ("pump"), current/voltage out of the cantilever/probe ("dump"), and write/erase. A maximum of only three lines may be routed to each probe/cantilever cell, namely one for supplying the pump charge, one for controlling the FET switch, and one for dumping the signal charge to a sense amplifier. In this arrangement, the diode may use less space than the FET used in FIG. 1.

From FIG. 4, a set of 16 cells are shown where elements of only one are specifically called out. Each row in FIG. 4 connects to a diode of a cell, while each column connects with a FET for each cell. The intersection between the row and column lines determine the cantilever selected. The magnitude of the write or erase current is dictated by the scaling of the cantilever FET device and the pulse amplitude applied to the row input. The FET scaling can provide heater current of varying magnitudes, including but not limited to in the range of approximately 600 microamps. The typical write current may be lower than the maximum FET current, and FET scaling is dictated by the peak write/erase current requirements.

In FIG. 4, voltage is provided from the left side and sensing occurs on the right. To the right side of FIG. 4 is a charge sense amplifier array 404 that receives signals from the cantilevers/probes 401. The charge sense amplifier array 404 may include charge preamplifiers 405a–d, FETs 406a–d, and capacitors 407a–d. The charge sense amplifier array 404 collects the signals and amplifies the signals to provide a sensed output, indicating the presence of a read bit. Each cell, such as cell 410, representing the components connected to the cantilever/probe. Diode 411 receives input from row 3, and sense capacitor 412 is connected to the cantilever/probe (not shown in this view). The input or control line for FET 413 is connected to column 3, and output thereof passes to the third sense line and onto the third sense array 401c. The FET 413 may comprise a MOS switch.

During the write or erase procedure, the system applies a bias to a column line connected to the gates of the FETs at the base of one leg of a column of cantilevers. This connection makes all these FETs conductive. The system then applies appropriate voltage to each row's charging line for writing or erasing. As shown in FIG. 4, charging lines are connected to diodes along a row of cantilevers. In each row, a current will flow through the write resistor of the cantilever whose FET is conductive, thereby heating the cantilever to the temperature desired for writing or erasing. The write or erase current can be grounded by switching the reset FETs 406 a–d for the sense amplifiers to a conductive state if the downstream electronics can provide a ground. Alternatively, the system may employ a switch to connect the sense lines (rows) to ground during write or erase. Some current may be forced into the capacitance associated with the cantilevers in the non-selected columns.

The thermal time constant of the write heater may be on the order of approximately one microsecond. In such an arrangement, approximately 250 picocoulombs may be required to heat the tip. Even for a system operating at the relatively high voltage of 10 V, the cell 410 may need a capacitance greater than approximately 25 picofarads to draw enough current to heat the tip to the writing or erasing temperature. Total capacitance of the cantilever, including the capacitance across a cantilever FET, can be held below 25 picofarads. To further enhance performance, voltages on the charging lines can be increased relatively slowly to a preset value at the beginning of a series of write or erase pulses. This slow voltage increase can pre-charge all non-selected cantilevers. As a result, as the diodes have a low reverse bias leakage current, unused cantilevers may remain partially charged during the writing process and current flow through their heaters can be minimized. The time constant for charging and discharging can be longer than the time between the application of write or erase pulses to a given row's control line in the arrangement shown in FIG. 4.

In providing current and voltage to the cantilever/probe for a read operation, the system applies a voltage to a column line that puts the FETs along the column line in a non-conductive state. At the same time, the system can apply a voltage to the other columns, thereby making the FETs either conductive or non-conductive. The system then applies a charging voltage to all row lines corresponding to cantilevers that are to be read. The charging voltage applied to appropriate row lines is of a sign and amplitude causing current to flow through the diodes and charge the sense capacitors to a desired level, or to "pump" the cantilever during an "initial phase." The system then turns off the row line voltages and applies a voltage to the column that is to be read, thereby switching the FETs to a conductive state that "dumps" charge from the cantilever capacitance into the sense circuit. The system holds the other columns lines at the same potential as during the initial phase. If the FETs associated with these columns are kept non-conductive throughout the read process, the system will not deposit the charge accumulated during the initial phase by the sense capacitors onto the sense lines in the subsequent phase. If the FETs are kept conductive throughout the read process, only a small amount of charge can accumulate on the sense capacitances during the initial phase. The FETs can be kept conductive in this manner only if the charging voltages are not large enough to cause currents to flow through the heating resistor that are large enough to cause unwanted writing or erasing. The charge held in the interrogated sense capacitors, such as sense capacitors 412, flows along the sense lines to the charge pre-amplifier, where the charge applies to the feedback capacitors 407a–d. This process can be repeated several times as long as the charge pre-amplifier does not saturate.

The read process is similar to that of FIG. 1 for the case where two FETs, or other switching devices, are used for each probe/cantilever. The difference is that a diode is employed, essentially as a one-way current valve, in place of one of the switches.

In practice, the FETs in the unread columns may remain in a non-conductive state during the read process. Leaving the FETs in a non-conductive state can minimize the current and power required of the circuits that charge the sense capacitors, and can reduce the probability of unintended writing or erasing. If FETs are left in a non-conductive state, contributions made to the signal from the unaddressed columns during the dump phase will be less of an issue. If the unread columns' FETs remain in a conductive state, any residual resistance across these FETs or resistance between the write heaters and FETs can cause the sense capacitors to charge to a certain level. In other words, if the non-selected column FETs are in a conducting state, the non-selected sense capacitor can develop a small charge during the pump phase. Once the pump voltage returns to near zero, a finite amount of time may be required for the small charge to discharge through the feedback capacitor. The result may be a build up of unwanted charge on the feedback capacitor. The present design addresses this problem by waiting until the unwanted charge discharges to a very small value prior to initiating the dump or integrating phase. If charges on the addressed column's sense capacitors are released too quickly after turning off the row line charging voltages, some level of charge may remain on the unaddressed sense capacitors. These unwanted charges may flow to the feedback capacitors, such as capacitors 407a–d, thereby reducing the SNR and causing the feedback capacitors to saturate more rapidly.

The diodes employed in this arrangement generally exhibit certain specific properties. When the charging voltage is turned off, the diodes may be left in a reversed biased state because the sense capacitance will be charged. Leakage of the sense charge across the diode 411 may be slow compared to the time needed to put the FET 413 into a conductive state and release the charge through the FET 413 and onto the sense line. This reverse bias condition sets a lower bound on the reverse bias impedance of the diode. Also, the capacitance to ground from the side of the diode 411 connected to the cantilever may not become unduly large, and the same holds true for the FETs. Capacitance should remain within a reasonable boundary because these capacitances are indistinguishable from the signal capacitance. These capacitances may be charged concurrent with the signal capacitance and add to the charge provided to the sense amplifier. This additional capacitance contributes to common-mode signal and can cause the sense amplifiers to saturate after fewer "pump" cycles than desired. The forward bias portion of the diodes' current-voltage (I-V) curve can be such that charging the sense capacitance does not take an unreasonable amount of time. As the sense capacitor charges, the voltage drop across the diode may tend to decrease, thereby increasing the effective resistance of the diode and lengthening the effective RC time constant for charging. In certain situations using the implementation shown, the sense capacitor can be charged to over half the applied charging voltage within approximately 20 nanoseconds, a reasonably rapid amount of time.

FET Controlled by Charging Voltage

An alternate design minimizing the number of lines routed to each probe/cantilever cell uses the same voltage that charges the sense capacitance to control one of the FETs. One embodiment of charging voltage FET control is presented in FIG. 5.

Figure 5:
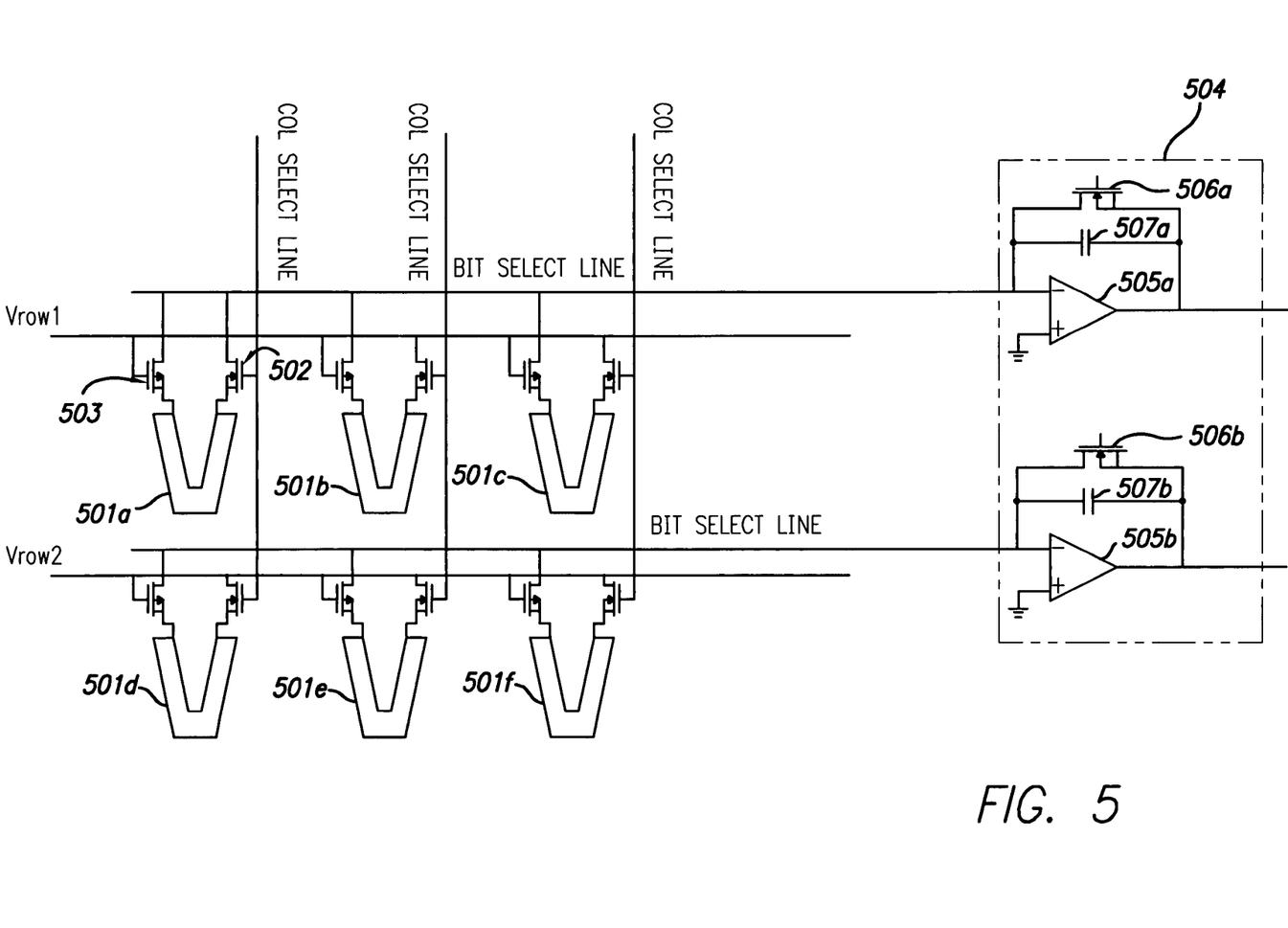
FIG. 5 illustrates an embodiment where FET switching is controlled by charging voltage.

Cantilevers or probes 501a, 501b, and 501c are on one bit line, while cantilevers 501d, 501e, and 501f are on another bit line in the configuration shown. More or fewer cantilevers, bit lines, and column select lines may again be provided depending on desired performance. To the right side of FIG. 5 is a charge sense amplifier array 504 that receive signals from the cantilevers/probes 501. The charge sense amplifier array 504 may include amplifiers 505a and 505b, FETs 506a and 506b, and capacitors 507a and 507b. The charge sense amplifier array 504 collects the signals and amplifies the signals to provide a sensed output, indicating the state of the read bits.

In FIG. 5, the gate of the FET controlling the pre-charge, FET 503, is connected to the row line supplying the charging current. In performing the write/erase function, the system applies a bias to all gates of the first FETs, such as first FET 502, along one column that leaves the first FETs in the conducting state. The system applies voltages to the gates of the FETs, such as FET 502, in the remaining columns to maintain the first FETs in the remaining columns in a non-conductive state. The system also applies an appropriate bias to each of the charging lines or rows shown in FIG. 5. These lines are connected to both the gates of the second FETs, such as FET 503, and the sources of the column FETs, such as FET 502. In a write/erase procedure, the system employs a row bias that makes the second FETs, such as FET 503, conducting and causes a heating current for writing or erasing to flow through the heating resistors of the probe/cantilevers, such as cantilever 501a, in the chosen column. Second FETs, including FET 503, may be designed so that the row-line voltages necessary for both the write and erase functions, when applied to the gates of the second FETs, also make the second FETs sufficiently conducting. Write or erase currents can be grounded by either switching the reset FETs for the sense amplifiers to a conductive state if the downstream electronics can provide a ground, or employing a switch to ground the sense lines, also known as bit lines, during the write/erase procedure.

An same FET control design can be used for read operations by applying a voltage to the gates of the first FETs, such as first FET 502, along one column, thereby leaving the first FETs conducting. The system applies a bias to the other columns that switches their first FETs to a non-conductive state. The system also applies a voltage to the row lines that puts the row FETs, or second FETs such as second FET 503, into a non-conductive state. This voltage simultaneously charges the sense capacitances in the selected column through the conductive first FETs in that column. The system then switches all column first FETs to a non-conductive state. The system applies a bias to the row lines, and this applied bias switches the row FETs or second FETs to a conductive state. This switching enables the charge stored on the sense capacitors in the selected column to be provided to row lines, labeled bit select lines, that pass the current to the charge pre-amplifiers in the charge sense amplifier array 504. In this arrangement, the second FETs exhibit characteristics enabling them to be placed into the proper conductive state by the charging voltages.

Use of Dummy Cells to Cancel Stray Capacitance

Figure 6:
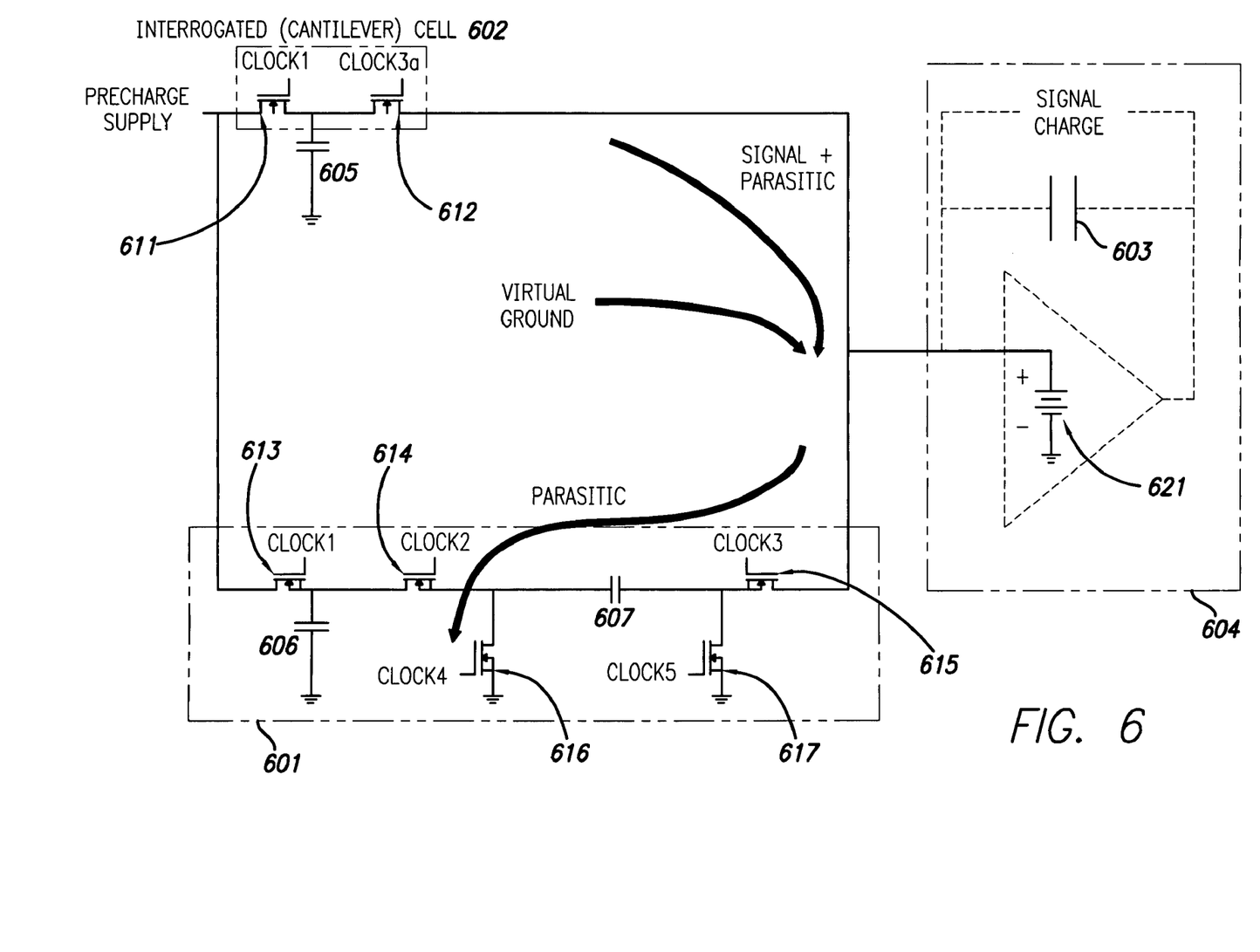
FIG. 6 is an embodiment comprising dummy cells to minimize stray capacitance.

Stray capacitance between portions of the electrical circuit positioned between the switches used in the above design, such as the diodes or FETs, and external elements is indistinguishable from signal capacitance. Even in a relatively small state-of-the-art device, the total capacitance charged during the "pump" phase will likely be much larger than the change in this capacitance due to deflection of the suspension resulting from a bit. Such capacitive charges adversely affect the SNR and can cause the sense amplifier's feedback capacitor to saturate the amplifier relatively quickly. Design of a charge integrator can be complex due to the parasitic capacitances which can be many orders of magnitude greater than the capacitance charges being sensed. The embodiment of FIG. 6 is a circuit scheme that cancels or nulls out the parasitic capacitances on the cantilever structure. In the embodiment of FIG. 6, a dummy cell generates equal but opposite charge to cancel out charges due to parasitic capacitances.

In FIG. 6, a dummy cell, such as dummy cell 601, is associated with each sense line row. One of the FETs in each of the cells shown in this figure can be replaced with a diode, as described above. Both cantilever cell capacitance 605 and dummy cell capacitance 606 are precharged to the same supply voltage when the switches 611 and 613 are turned on by clock1. At clock p2, the circuit shown turns on switches 614 and 617, transferring the dummy or offset charge to capacitor 607. The integration cycle starts at the rising edge of clock p3, and during integration both the cantilever cell charge and dummy cell charge transfer to the virtual ground of the charge integrator. During clock p3, the circuit turns on switches 615 and 616. Since the plate of capacitor 607 is charged negative with respect to the left side of capacitor 607, grounding the left plate of capacitor 607 via switch 616, resulting in a current flow out of the integrator input node. The result is the inversion of the dummy cell charge and generation of the opposite charge. In the integration phase, clock p3 is active, switch 612 turns on, and the charge from the cantilever cell "dumps" onto the integrator node. The cantilever cell charge is positive, and the result is current flowing to the integrator node. Thus the cantilever charge and dummy charge flow in opposite directions with respect to the virtual ground node.

In the approach shown in FIG. 6, a switched-capacitors circuit design is employed. The switched-capacitor design requires a three phase non-overlap clock to control the various MOS switches. Operation of the circuit can be divided into three phases. During phase 1, both the dummy cell 601 and the cantilever cell 602 are charged to a positive bias voltage. In phase 2, the dummy cell charge is transferred to another storage capacitor, such as capacitor 607, where the charge is inverted. Finally at phase 3, both the cantilever charge and dummy charge are simultaneously dumped onto the summing node of the integrator circuit 604 where the two charges are integrated together. When the system combines the charges from the dummy cell 601 and interrogated cell 602, the charges nearly cancel if the dummy cell 601 is well matched to the interrogated cell 602. Differences in the sense capacitance due to the presence or absence of a bit in this arrangement contribute a much bigger fraction of the charge that appears on the feedback capacitor. Thus a smaller feedback capacitor 603 can be used on the sense amplifier 604, resulting in higher gain, and/or more energy "pumps" may be employed prior to saturation. The present dummy design can be implemented using a fixed, dummy capacitor, such as feedback capacitor 603, in place of a dummy probe/suspension. If an identical probe/suspension is employed in close proximity to other cells on a sense line, common mode noise sources such as vibrational noise or electrical pickup can be reduced in certain cases.

The cantilever cell 602 includes capacitor 605. Capacitor 605 represents the parasitic capacitance of the cantilever cell 602. The dummy cell 601 includes capacitor 607 representing the total parasitic capacitance of the cantilever cell structure. The dummy cell structure can be designed to closely match the cantilever cell structure minus the variable or signal capacitance in order to match or closely reproduce the parasitics. In order to invert the dummy cell charge, the charge is first transferred to a storage capacitor (not shown) where MOS switches 614, 616 and 617 invert the charge polarity.

The charge integrator is modeled as an ideal integrator by using a 0 Volt voltage source 621. The voltage source 621 presents a virtual ground to the cantilever and dummy charges. The final output charge is the result of integrating the currents that flows through this node.

During phase 1, both the cantilever cell 602 and dummy cell 601 capacitance are pre-charged to the bias supply voltage when switches 611 and 612 are turned on by clock p1. Also during this time, MOS switches 616 and 617 are turned on to discharge the storage capacitor 607. During phase 2, MOS switches 614 and 617 are turned on, transferring the dummy charge to the storage capacitor 607. Due to the capacitor divider effect of 607 and 606, not all of the charge on the dummy cell 601 is transferred to the storage capacitor 607. The dummy cell 601 capacitance can be adjusted to compensate for an incomplete charge transfer.

The purpose of the storage capacitor 607 and associated MOS switches is to invert the charge. During phase 2, the storage capacitor 607 is charged so the left plate is charged positive which induces a counter or negative charge on right plate of storage capacitor 607. During phase 3, MOS switches 612 and 615 are turned on to dump both the cantilever and dummy charge onto to the charge integrator. Also during phase 3, the left plate of the storage capacitor 607 is grounded by MOS switch 616 while the right plate of the storage capacitor 607 is connected to the virtual ground of the charge integrator stage. Since the right plate of storage capacitor 607 is charged negative with respect to the left plate, the charge flows from the virtual ground to the storage capacitor 607. For the cantilever cell 602, the top plate of 605 has a positive charge, so when the node is connected to the virtual ground of the integrator stage, the charge on capacitor 605 flows from capacitor 605 to the virtual ground. Since the cantilever and dummy charge flow in opposite directions, the parasitic charge tends to cancel each other out, leaving only the charge due to the signal component.

One aspect of the present design is thus a method for reading data bits stored on a storage medium. The method may use a data probe structure attached to a charge amplification structure supplying an output voltage. The data probe structure may include a plurality of switches. The method comprises applying a voltage to the data probe structure sufficient to change the state of a switch associated with the data probe structure, employing a further voltage to provide charge to the charge amplification structure, repeating the employing at least once to increase charge supplied to the charge amplification structure, and subsequently transmitting the output voltage from the charge amplification structure.

Alternate Lock-In Amplifier Design

Figure 7:
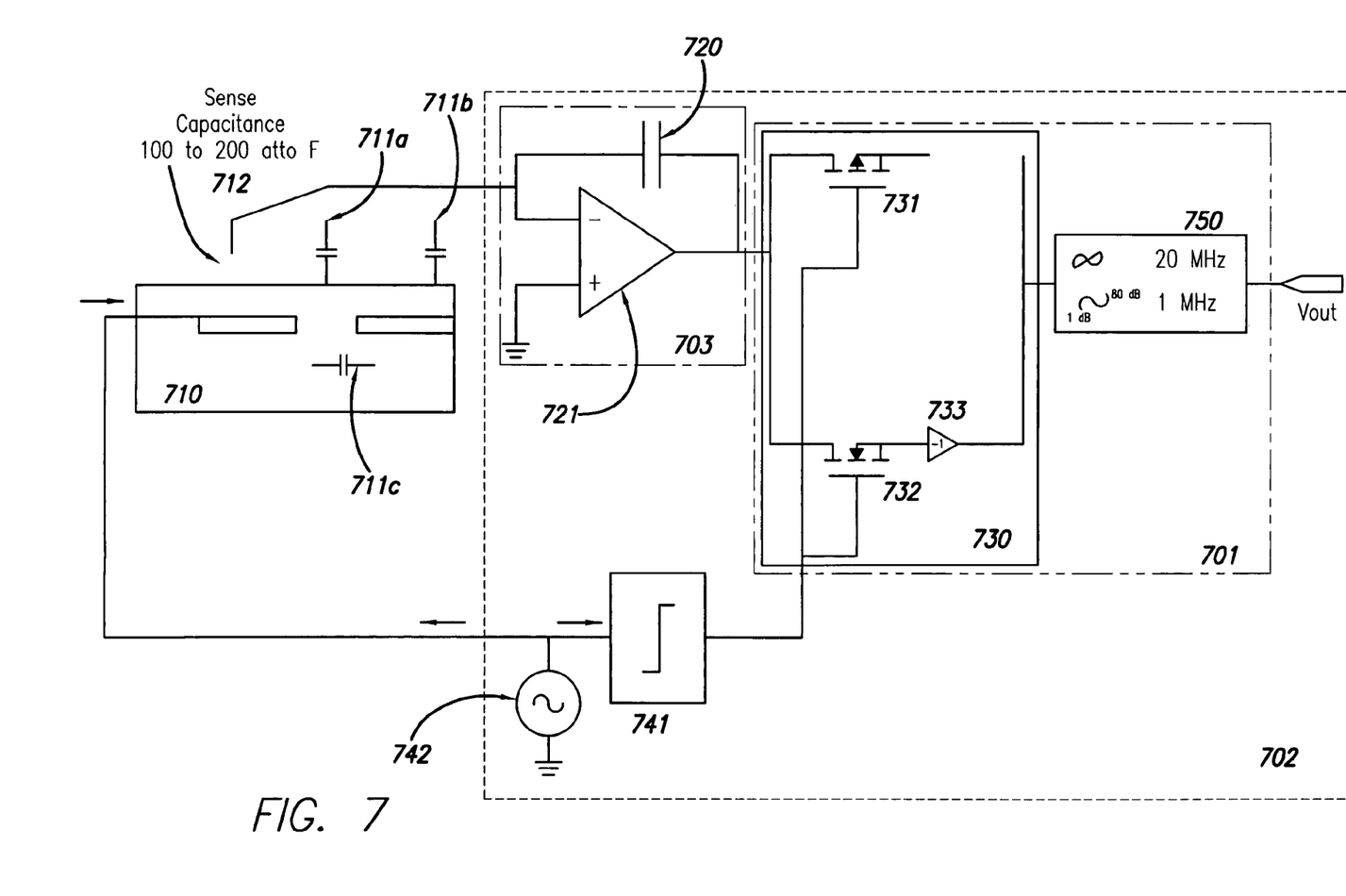
FIG. 7 illustrates a lock-in amplifier embodiment.

An alternate design for storing and retrieving ultra-high density data employs a lock in amplifier, or synchronous detection, as shown in FIG. 7. From FIG. 7, the system may modulate an RF carrier signal by varying cantilever capacitance as the tip moves in and out of the data pit of the written bit. The lock-in amplifier 701 is tuned to measure carrier frequency so noise signals at frequencies other than the reference frequency may be rejected and may not affect the measurement.

From FIG. 7, cantilever chip 702 includes lock-in amplifier 701 and capacitance preamp 703. Media chip 710 includes three leakage paths 711a, 711b, and 711c. Sensor capacitance is provided on the cantilever 712, which is attached to the capacitance preamp 703 of the cantilever chip 702. Sensor capacitance may vary and may, in the situation illustrated, provide 100 to 200 atto F. Cap preamp 703 includes capacitor 720 and amplifier 721. Lock in amplifier 701 includes demodulator 730, including switches 731 and 732 and inverter 733. Lock in amplifier 701 further includes 1 MHz Low Pass component 750 and output voltage is shown connected to the 1 MHz Low Pass component 750. The switches 731 and 732 are connected to zero-crossing detector block 741, connected to the AC voltage source 742.

The lock-in amplifier is a synchronous demodulator followed by a low-pass filter to suppress the carrier feed through at the output. The overall bandwidth is generally dictated by the low pass filter. The carrier frequency may be selected to have the low pass filter provide sufficient attenuation, such as on the order of greater than 80 dB. A four pole filter may be employed with a selected carrier frequency of approximately 20 times the low-pass filter cutoff frequency to ensure adequate carrier suppression. In the case of a 1 MHz signal bandwidth, a 20 MHz carrier may be employed.

The lock-in approach may provide noise rejection and sufficient sensitivity without the need of the cantilever isolation FETs. Using the lock-in approach, a relatively small signal may be measurable against the background of large amount of uncorrelated noise when the frequency and phase of desired signal are known. The lock-in technique tends to reduce the requirement for cantilever isolation FETs and the space required by such FETs. Using the lock-in approach, the carrier frequency may be AC coupled to the media chip, eliminating direct connection to the media. The signal reference may be AC coupled to the media layer from the top via the cantilever chip 702 or through the bottom via the rotor assembly (not shown). In this arrangement, the signal may be proportional to carrier amplitude. Detection is sensitive to both the amplitude and phase of the carrier.

While the aforementioned and illustrated devices and methods for storing and retrieving ultra-high density data have been described in connection with exemplary embodiments, those skilled in the art will understand that many modifications in light of these teachings are possible, and this application is intended to cover any variation thereof. Accordingly, any and all modifications, variations, or equivalent arrangements which may occur to those skilled in the art, should be considered to be within the scope of the present invention as defined in the appended claims.

What is claimed is:

1. An apparatus for reading data bits stored on a storage medium, comprising:
   a data probe structure comprising a data probe, a sense capacitance that depends upon the state of the data bit being probed by the data probe structure, and at least one switch attached to the data probe;
   at least two controllable voltage sources configured to supply voltage to the data probe structure; and
   a charge amplification structure configured to receive charge from the data probe structure;
   wherein one controllable voltage source applies a first voltage to charge the sense capacitance and another controllable voltage source subsequently applies a second voltage to one switch, thereby causing the one switch to close and provide output charge to the charge amplification structure.

2. The apparatus of claim 1, wherein multiple cantilever arms are employed and multiple voltage sources apply voltages to charge sense capacitances and alternate controllable voltage sources subsequently apply second voltages to switches to read multiple data bits.

3. The apparatus of claim 1, wherein the data probe structure comprises a cantilever arm having a tip, wherein the cantilever arm is deflected primarily in a direction perpendicular to the storage medium when the tip passes over the written data bit, thereby altering a sense capacitance.

4. The apparatus of claim 1, wherein the first charging voltage and the second voltage are delivered using a single control line.

5. The apparatus of claim 1, wherein the apparatus is further configured to write a data bit, and writing includes a voltage source applying an additional voltage to a different switch connected to the data probe structure, causing the different switch to close.

6. The apparatus of claim 1, wherein one of the voltage sources applies the first voltage through a diode connected to the data probe structure.

7. The apparatus of claim 1, further wherein one of the voltage sources applies the voltage to a dummy cell connected in parallel with the data probe structure, thereby minimizing parasitic effects.

8. A method for reading data bits stored on a storage medium using a data probe structure attached to a charge amplification structure supplying an output voltage, said data probe structure comprising a plurality of switches, the method comprising:
applying a voltage to the data probe structure sufficient to change state of a switch associated with the data probe structure;
employing a further voltage to provide charge to the charge amplification structure;
repeating the employing at least once to increase charge supplied to the charge amplification structure; and
subsequently transmitting the output voltage from the charge amplification structure.

9. The method of claim 8, wherein said applying and subsequently transmitting comprises sequentially opening then closing a first switch while simultaneously closing then opening a second switch to enable current to flow into and then out of the data probe structure.

10. The method of claim 8, wherein the data probe structure comprises a cantilever arm having a tip and the cantilever arm is deflected when the tip moves over a written data bit.

11. The method of claim 8, wherein said employing is controlled by a single data line.

12. The method of claim 8, further comprising applying a different voltage to a different switch connected to the data probe structure as part of providing charge to the charge amplification structure.

13. The method of claim 8, further comprising applying an additional voltage to one end of a diode connected to the data probe structure.

14. The method of claim 8, further comprising applying the further voltage to a dummy cell in addition to the data probe structure.

15. The method of claim 14, wherein applying the further voltage provides a reference signal for parasitic effects.

16. An apparatus for reading data bits stored on a storage medium, comprising:
a controllable voltage source;
a data probe structure configured to receive a first voltage from the controllable voltage source, the data probe structure comprising a switch controlled by a single control line; and
a charge amplification structure configured to receive voltage from the data probe structure.

17. The apparatus of claim 16, wherein the controllable voltage source applies the first voltage through a diode of the data probe structure and subsequently applies a second voltage to the switch of the data probe structure, thereby causing the switch to close and provide output charge to the charge amplification structure.

18. The apparatus of claim 16, wherein the data probe structure is configured to close the switch, thereby applying current to the data probe structure and from the data probe structure to the charge amplification structure.

19. The apparatus of claim 16, wherein the data probe structure comprises a cantilever arm having a tip, wherein the cantilever arm is deflected primarily perpendicular to the plane of the storage medium when the tip is scanned across a written data bit, thereby altering a sense capacitance.

20. The apparatus of claim 16, further wherein the controllable voltage source applies the voltage to a dummy cell connected in parallel with the data probe structure, thereby minimizing parasitic effects.

21. An apparatus for reading data bits stored on a storage medium, comprising:
a voltage source;
a data probe structure configured to receive a charging voltage from the voltage source;
a dummy cell arrangement connected in parallel with the data probe structure and configured to also receive the charging voltage from the voltage source; and
a charge amplification structure configured to receive differential charge from the data probe structure and the dummy cell arrangement;
wherein the charge accumulated on the dummy cell arrangement is subtracted from the charge accumulated on the data probe structure thereby tending to cancel parasitic effects encountered by the data probe structure.

22. The apparatus of claim 21, wherein the data probe structure comprises a data probe cell capacitor and the dummy cell arrangement comprises a dummy cell capacitor.

23. The apparatus of claim 22, further wherein the apparatus is configured to apply current to the data probe structure and from the data probe structure to the charge amplification structure.

24. The apparatus of claim 22, wherein the dummy cell capacitor passes charge to a dummy cell in-line capacitor, and said dummy cell in-line capacitor generates an opposite charge prior to transferring charge capacitance to the charge amplification structure.

25. The apparatus of claim 21, wherein the data probe structure comprises a cantilever arm having a tip, wherein the cantilever arm moves when the tip is scanned across a written data bit, thereby altering a sense capacitance.

26. The apparatus of claim 21, wherein the data probe structure is controlled using a single data line.

27. The apparatus of claim 21, charge on the dummy cell and charge on the data probe structure flow in opposite directions with respect to a virtual ground node between the dummy cell and the data probe structure.

28. An apparatus for writing data bits on a storage medium, comprising:
- a data probe structure comprising a data probe and at least one switch attached to the data probe; and
- a controllable voltage source configured to selectively supply voltage to the data probe structure to accumulate charge to a certain level and later dissipate said charge to a charge sense amplifier array.

29. The apparatus of claim 28, wherein said at least one switch comprises an open first switch and a closed second switch, and said controllable voltage source applies voltage to increase the charge contained within the data probe structure.

30. The apparatus of claim 29, further comprising a second voltage source employed to activate a switch that pass charge to the charge sense amplifier array.

31. The apparatus of claim 28, wherein said at least one switch comprises a closed first switch and an open second switch, and another controllable voltage source applies voltage to affect the closing and opening of said switches, thereby dissipating the charge contained within the data probe structure to the charge sense amplifier array.

32. The apparatus of claim 28, wherein said at least one switch comprises a closed first switch and a closed second switch, and an alternate voltage source applies voltage to write the data bit.

33. The apparatus of claim 28, wherein said at least one switch comprises a closed first switch and a closed second switch, and said alternate controllable voltage source applies voltage to erase a written data bit.

34. The apparatus of claim 28, further comprising a diode between the voltage source and the data probe structure, said diode acting as a one-way current flow device.

35. An apparatus for reading data bits on a storage medium, comprising:
- a cantilever arm scanned across the storage medium and configured to generate a sense capacitance between portions of the cantilever arm and the storage medium; and
- a cantilever chip comprising a capacitive preamp and a lock-in amplifier, said cantilever chip modulating a radio frequency (RF) signal by varying the cantilever sense capacitance as the cantilever scans across the storage medium and is deflected by interaction with topographic bits.

36. The apparatus of claim 35, wherein the lock-in amplifier comprises a demodulator circuit.

37. The apparatus of claim 36, wherein the lock-in amplifier further comprises a low-pass filter.

38. The apparatus of claim 35, wherein the lock-in amplifier locks in to measure carrier frequency such that noise signals at frequencies other than the reference frequency are rejected.

39. The apparatus of claim 35, wherein the lock-in amplifier is a synchronous demodulator followed by a low-pass filter to suppress carrier feedthrough.

\* \* \* \* \*

UNITED STATES PATENT AND TRADEMARK OFFICE
CERTIFICATE OF CORRECTION

PATENT NO. : 7,212,488 B2 Page 1 of 1
APPLICATION NO. : 11/085939
DATED : May 1, 2007
INVENTOR(S) : Gary Gibson et al.

It is certified that error appears in the above-identified patent and that said Letters Patent is hereby corrected as shown below:

On the title page, item (56), under "U.S. Patent Documents", in column 1, line 3, delete "4,340,958 A    7/1982 Dennis et al." and insert -- 4,340,956 A    7/1982 Miller. --, therefor.

On the title page, item (56), under "U.S. Patent Documents", in column 1, line 8, delete "4,998,018 A    3/1991 Kurahashi et al.". (Entry Repeated)

On page 2, item (56), under "U.S. Patent Documents", in column 1, line 25, delete "6,401,528 B1    6/2002 Lambert et al." and insert -- 6,401,526 B1    6/2002 Dai et al. --, therefor.

Signed and Sealed this

Fourth Day of November, 2008

JON W. DUDAS
*Director of the United States Patent and Trademark Office*